Nov. 4, 1969 G. J. TIBOL 3,476,984

SCHOTTKY BARRIER SEMICONDUCTOR DEVICE

Filed Nov. 10, 1966 2 Sheets-Sheet 1

INVENTOR.
GEORGE J. TIBOL
BY
Robertson, Bryan, Parmelee & Johnson
ATTORNEYS.

Nov. 4, 1969 G. J. TIBOL 3,476,984

SCHOTTKY BARRIER SEMICONDUCTOR DEVICE

Filed Nov. 10, 1966 2 Sheets-Sheet 2

INVENTOR.
GEORGE J. TIBOL
BY
Robertson, Bryan, Parmelee & Johnson
ATTORNEYS.

3,476,984

SCHOTTKY BARRIER SEMICONDUCTOR DEVICE

George J. Tibol, Fairview, N.J., assignor to Solitron Devices, Inc., Tappan, N.Y., a corporation of New York Filed Nov. 10, 1966, Ser. No. 593,541
Int. Cl. H01l 5/00; B44d 1/18
U.S. Cl. 317—234 10 Claims

ABSTRACT OF THE DISCLOSURE

A semiconductor device having a clean Schottky barrier junction includes a passivation layer overlying and sealing the metal barrier layer to protect the metal barrier layer from contamination.

This invention relates to a metal to semiconductor junction and the process of making it. The junction is substantially free from any contaminants, i.e., substantially atomically clean, and so is capable of producing a true, abrupt Schottky barrier.

In conventional techniques used to fabricate p-n junctions, the diodes have included insulated semiconductor material such as gallium arsenide, germanium, silicon or cadmium sulfide. A controlled amount of impurities has been diffused or alloyed into these materials in order to form a rectifying junction. Generally, the atoms used for these impurities are trivalent or pentavalent and produce a semiconductor body having n- or p-type conduction.

Since cross-contamination of materials used to fabricate the junctions cannot be prevented completely, the resultant semiconductor normally includes a certain number of minority carriers available for conduction. As a result, when the diode is operated in a switching or high frequency circuit, time is required for these minority carriers to stop providing conduction.

The equivalent circuit for this diode, then, will contain a capacitor component shunted by a resistance component. The capacitor will be charged during the operation of the diode, providing a stored charge which, during switching, the minority carriers then conduct across the junction. This tends to continue the current flow in the original direction and to lengthen the switching time. Similarly, when the diode is switched on again, the switching time is lengthened by re-establishment of current flow by the minority carriers. For fast recombination rate, the minority carrier current flow must be substantially reduced.

In the manufacture of metal to semiconductor junctions, past practice, except perhaps for whisker or point contacts, has resulted in a certain number of trapped impurities between the metal and the semiconductor. These impurities served to produce a low breakdown voltage and distorted barrier characteristics because of their finite resistance.

Many years ago Schottky analyzed the metal-semiconductor junction and developed a theory relating to space charge at the junction. See, for example, Shockley, Electrons and Holes in Semiconductors, D. Van Nostrand, 1950, p. 100. Due to inability to produce a junction having sufficient purity (except for occasional trial and error work with a cat's whisker) the abrupt Schottky-type barrier could not be made as a junction device.

I have discovered how to make a metal-semiconductor junction of sufficient purity that the Schottky effect can be utilized. By so placing the metal in atomically close contact with the pre-doped semiconductor a very abrupt Schottky type barrier is created.

The primary advantage of my invention lies in depositing a barrier metal over atomically clean silicon, germanium or other semiconductor material. Another advantage of my invention is that a barrier is created over a semiconductor surface which contains no oxides, fluorides, or other foreign substances.

There are various other advantages of my invention. A metal-to-semiconductor junction is produced having an abrupt barrier of the true Schottky type. The semiconductor surface is cleaned by chemical means with no contamination of significance occurring between cleaning and production of a metal barrier layer. A diode is produced having a p-n junction with a phenomenally low stored charge, in the order of one to two picocoulombs, as contrasted with a normal junction having a stored charge in the order of 1,000 picocoulombs. This diode is capable of exceedingly fast switching, in the order of 10,000 megacycles per second, that is, it has a switching speed of approximately 100 picoseconds. The diode may have a forward knee as low as 0.25 volt, and a reverse voltage as high as 50 volts, thus improving the efficiency of operation of circuits containing my device. The burnout pulse which the diode can accept without breakdown is high, in the order of 50 to 100 ergs. In addition, the junction has a low noise level, in the six to eight decibel range.

Other and further advantages of my invention will appear in the within disclosure considered in conjunction with the drawings.

In summary, my results are accomplished by producing a barrier metal junction with the semiconductor material by depositing the metal in place simultaneously or substantially simultaneously with the final cleaning step so that, in effect, metal is deposited to substitute for the last remaining impurities on the surface of the semiconductor material.

Turning to the drawings, FIGS. 1A through 1J are sectional views at greatly enlarged scale showing successive steps followed in producing the atomically clean, abrupt metal-semiconductor junction of my invention.

Figure 1A:
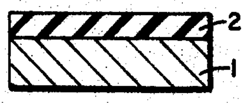

FIGS. 1A through 1J disclosed the constructional steps in my process. In FIG. 1A, there is shown a small slice or wafer of the semiconductor material 1 used in producing the diode. This material is preferably of silicon or germanium, suitably doped. If desired, it can include a lower layer of low resistivity and an upper epitaxial layer of high resistivity semiconductor material, as may be desired for adapting the diode to a particular application. Deposited on one surface of the semiconductor material 1 is an insulation layer 2, grown thermally or otherwise, in the usual manner. This insulation layer 2 may be silicon dioxide, silicon oxide, silicon nitride, silicon carbide, or aluminum oxide, for example.

Figure 1B:
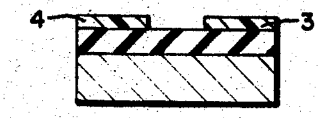

FIG. 1B shows light-sensitive masking material 3 applied to insulation layer 2 in the desired configuration and having an opening 4 therein defining the area from which the insulation layer 2 is to be removed in readiness for creation of a barrier junction.

Figure 1C:
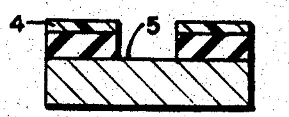

FIG. 1C shows the unit after photo-etching with, for example, hydrofluoric or nitric acid. The insulation layer 2 has been removed in the area defined by opening 4 leaving exposed a junctional area 5 on the surface of semiconductor material 1.

Figure 1D:

The masking material 3 is then removed, and the device, as shown in FIG. 1D, is ready for deposition of the metal layer in accordance with the practice of my invention.

A metal layer 10 (FIG. 1E) is then deposited on the surface 5, creating a barrier junction between metal layer 10 and semiconductor material 1 which is substantially atomically clean. This metal-semiconductor junction, having substantially no impurities between the metal and the semiconductor, is achieved by the simultaneous cleaning and deposition process of my invention, as will be described below. Preferably, the metal layer 10 is made of copper, but other metals such as cadmium, nickel, lead, tin, gold, platinum, and palladium may be used.

Metal layer 10 is preferably of a thickness of about 2000 to 5000 angstroms. It should be at least 1000 angstroms thick to assure that it is not destroyed during subsequent processing steps. Layer 10 extends over the entire surface 5 and abuts against the edges of insulating layer 2.

A layer 12 of molybdenum or titanium is then deposited over the metal layer 10 and also over the portion of insulation layer 2 adjacent said metal layer 10. It should have a thickness of 4000 to 5000 angstroms. This second layer 12, in conjunction with layer 2, acts as a passivation layer and seals in the metal barrier layer 10 so that no later contaminations can occur at the periphery of the junction. For greatest reliability, the entire periphery of the area of junction will be sealed by insulating material 2.

Figure 1E:
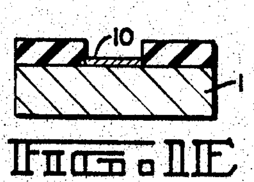
Figure 1F:
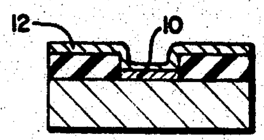
Figure 1G:
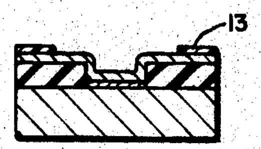

Layer 12 is preferably applied by normal high energy sputtering techniques. For example, the treated slice 1 in the condition, as shown in FIG. 1E may be passed through a vacuum deposition chamber, the slice being connected as the anode, and the cathode having a layer of molybdenum or titanium thereon. The anode and cathode are preferably spaced three inches or slightly more apart and they have an electric field imposed between them of 2000 to 3000 volts, DC. The level of the vacuum in the deposition chamber should be of the order of 50 microns of mercury.

A photo-resist ring 13 (FIG. 1G) is then placed on the periphery of layer 12, leaving exposed the central portion of layer 12, including a portion of that layer overlying insulation layer 2.

Figure 1H:
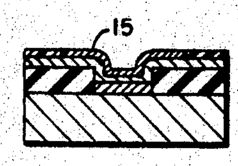

Thereafter, a gold layer 15, as shown in FIG. 1H, to the extent of about 500 angstroms in thickness, is deposited on the exposed portions of layer 12 inside the photo-resist ring 13 by normal electroplating.

Figure 1J:
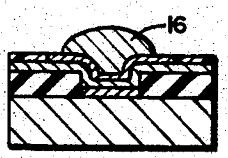
Figure 2:
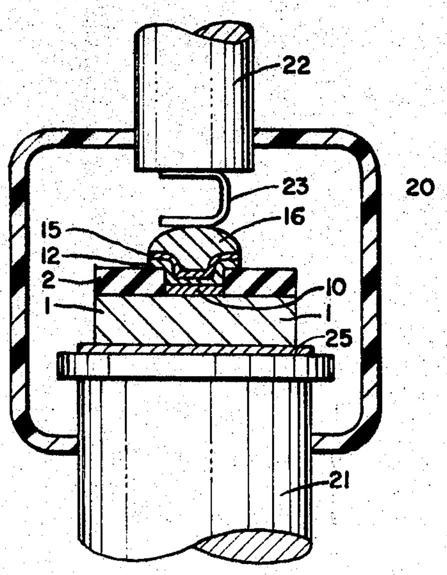
FIG. 2 is a section showing a finished and assembled diode incorporating my invention.

A contact 16 of gold plate, in the form of a button of about 1 mil thickness is then plated over layer 15 by conventional electroplating techniques, as shown in FIG. 1J. Thereafter, if desired, as is indicated in FIG. 1J, the photo-resist ring 13 may be removed and the portions of layer 12 immediately therebelow etched away.

The finished diode is then encapsulated in the usual form of container 20 having leads 21 and 22 extending therein. Lead 22 is connected to the gold contact button 16 through a resilient C-shaped band 23; and the semiconductor portion 1 is connected to lead 21 through an ohmic contact 25 created by a soldered connection or the like.

The heart of my invention lies in the method of making the metal to semiconductor junction substantially free from any contaminants. This gives, in effect, the desired abrupt junction which can be achieved only with a substantially atomically clean junction. The steps toward producing this junction are shown in the flow diagram of FIG. 3. Stages I and II of that flow diagram relate to the masking and etching steps shown in FIGS. 1A through 1D. The necessary masking and etching is done so that surface portion 5 of semiconductor 1 is exposed for the deposition of the metal barrier-creating layer 10.

It is now necessary to clean surface portion 5 completely so as to remove all contaminants. A preferred method for cleaning is to wash the semiconductor in hot sulfuric acid for 10 to 25 minutes at 90 to 100° C. to remove all organic substances (stage III). This is followed by a rinse in water that has been deionized sufficiently so that its conductivity is no greater than 10 to 15 megohms per square centimeter (stage IV). The slice 1, and in particular, surface 5, is then cleaned in a solution of hydrofluoric acid in water. Ammonium fluoride may also be present if desired. Concentrations can be from as low as 1% of 45% hydrofluoric acid to as high as about 80% of 45% hydrofluoric acid in water. A weaker solution, such as the 1% solution, is preferred so that cleaning is achieved without the possible destruction of the remaining masking layer 2. When the 1% solution is used the cleaning time takes approximately 30 seconds; when the 80% solution is used, the cleaning only takes one to two seconds (stage V).

The metal barrier layer 10 is then deposited over surface layer 5 (stage VI). This is done, however, without prior removal of the hydrofluoric acid solution. By so depositing layer 10, no chance of contamination occurs between the cleaning and deposition steps, and so metal can be deposited on an atomically clean surface. The deposition is made at least simultaneously with the completion of said acid cleaning step so that in effect, the metal is substituted for the impurities, as they are removed.

One method of depositing a metal layer 10 is to use a copper sulfate in water solution, preferably a saturated solution at 25° C., and deposit the copper directly on surface 5. The copper is deposited by spraying or pouring the copper sulfate solution over the slice 1, that is, over the exposed surface 5, preferably while the hydrofluoric acid cleaning solution is still on the surface 5. When a saturated copper sulfate solution is used, deposition of the copper takes place at the rate of approximately 5000 to 8000 angstroms of thickness every 60 seconds. As previously stated, it is undesirable to have a layer of less than 1000 angstroms thickness, and, accordingly, the minimum time for deposition should be about 12 seconds (stage VI).

After the necessary time has passed to obtain a deposit of copper to the desired thickness, the slice is rinsed for one to twenty minutes in deionized water (stage VII). The slice then appears as is shown in FIG. 1E. The remaining plating steps, previously described in connection with FIGS. 1F through 1J follow:

An alternative copper plating solution which may be used in lieu of copper sulfate is a saturated solution of copper nitrate. The procedure followed is the same as with the copper sulfate, the nitrate solution being poured over or sprayed on a slice of semiconductor material while the hydrofluoric acid cleaning solution is still present.

As can be seen, one plating system used for producing barrier junctions is the electroless plating technique. In practicing my invention, however, the technique is used in the presence of a cleaning solution and for the purpose of depositing a metal layer on an atomically clean semiconductor surface to create an abrupt barrier function. The deposited metal is substituted for the impurities as they are displaced by the cleaning solution, or no later than simultaneously with the end of the cleaning step, and so there is no possibility of intervening contamination occurring.

Other solutions may be used, if desired, either with copper as the deposited metal, or salts of the previously mentioned metals. In many instances, the solution need be no different from one of the electroless plating solutions available commercially. It must, however, be a solution that is compatible with the hydrofluroic acid cleaning solution, that is, it must work in effect on a substantially substitution basis, as previously described, in the presence of the acids.

In some instances, such as with metallic fluoroborates, where this compatibility with acid may not exist, my invention may still be practiced. Other compatible cleaning solutions may be used or, alternatively, the cleaning solution may be replaced with deionized water, and then the deionized water replaced with the plating solution. This technique is the equivalent of the previously mentioned substitution technique if it assures that no contamination takes place between the cleaning step and the plating of the metal barrier 10.

The examples of plating solutions that may be used are as follows:

Example I

Sulfate solutions may be used, such as a solution of copper sulfate, preferably a solution which is saturated at 25° C.

Example II

Copper nitrite crystals may be dissolved in water to form a saturated solution. It may be used saturated or diluted with distilled water.

Example III

A fluoroborate solution may be used such as copper fluoroborate. One example would include, by weight, copper fluoroborate 46%, acid 3%, free fluoroborate acid 3%, distilled water 48%, producing a solution having a specific gravity of 1.55.

It has been found that diodes having the metal to semiconductor junction of my invention have desirable operating parameters not found in other diodes. Various forward and reverse parameters can be obtained in diodes which exhibit low stored charge characteristics. This low stored charge, as mentioned above, permits very fast recovery and rapid switching characteristics. As an example, utilizing the process of my invention, many diodes have been made having characteristics as set forth below:

| | Forward Current, ma. | Forward Knee, v. |
|---|---|---|
| Breakdown Voltage, v.: | | |
| 5 | 10 | 0.25 |
| 5 | 100 | 0.25 |
| 20 | 100 | 0.25 |
| 30 | 100 | 0.25 |
| 50 | 10 | 0.25 |

As given in the above table, the breakdown voltage is minimum reverse breakdown voltage measured at 10 micromaperes D.C.; forward current is the current value measured at 1.0 volt D.C., and forward knee is maximum measured at 1.0 ma. D.C. The characteristics are given for 25° C.

Figures 3, 4:
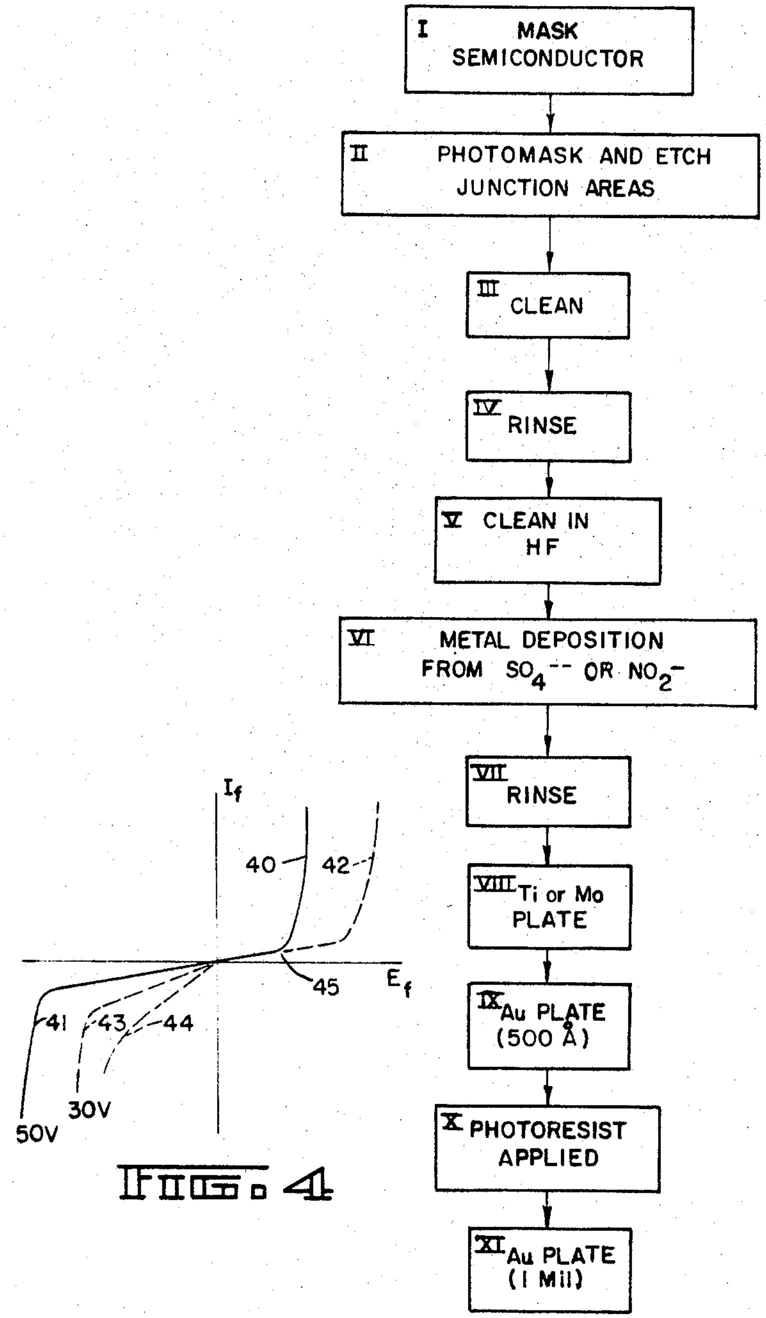
FIG. 3 is a flow chart showing the steps followed in practicing the process of my invention.
FIG. 4 is a plot showing the operating characteristics that can be achieved by the diode of my invention.

FIG. 4 is a plot showing the operating characteristics of my diode as compared with those of previously available diodes. The characteristics of my diode are shown by solid lines 40 and 41; the characteristics of prior diodes, by dotted lines 42, 43, and 44. It can be seen that the forward knee 45 of my diode is at a lower forward voltage $E_f$, and the reverse breakdown voltage is at a higher reverse voltage than in the prior art. The knee of my diode may be as low as 0.25 volt; the reverse breakdown voltage, as high as 50 volts.

Another characteristic of the junction of my invention is the excellent burning power or burnout level obtained. Burnout may be defined as the change in rectifying properties or other deterioration of the diode resulting from the application of an excessive electrical overload. See, for example, H. C. Torrey and C. A. Whitmer, Crystal Rectifiers, McGraw-Hill, 1948, p. 236 et seq.

In the particular use of burnout characteristics in the metal to semiconductor junction of my invention, a short D.C. pulse is applied in the reverse direction, and a determination is made of the energy in ergs which the junction can withstand prior to burnout. See Torrey & Whitmer, supra. In testing my junctions, the reverse breakdown voltage is measured first, and the junction then subjected to the D.C. pulse of known energy level. It will be found that my diodes can withstand a burnout load in the order of from about 50 to about 100 ergs before appreciably affecting the reverse breakdown voltage. In contrast, prior junctions would burnout at 30 or less ergs.

It should be noted that the burnout level is not a function of the area of the junction. This is so since burnout, in effect, tests the weakest point in the junction. Consequently, burnout level is a particularly appropriate identifying characteristic of the cleanliness and absence of contamination of my junction.

What I claim is:

1. A semiconductor device having an abrupt Schottky barrier comprising a wafer of semiconductor material, an insulation layer on one surface thereof and defining an opening on said surface, a metal layer on said surface forming a junction with said semiconductor material and filling said opening and a passivation layer overlying said metal layer and the portion of said insulation layer surrounding said opening to seal said metal layer from contaminants at the peripheral portions of said metal layer.

2. A semiconductor device as defined in claim 1 wherein said metal layer has a thickness of at least 1000 angstroms.

3. A semiconductor device as defined in claim 2 wherein said metal layer has a thickness in the range of about 2000 to 5000 angstroms.

4. A semiconductor device as defined in claim 1 including a protective coating overlying said passivation layer.

5. A semiconductor device as defined in claim 4 wherein said protective coating has a thickness of about 500 angstroms.

6. A semiconductor device as defined in claim 5 wherein said protective coating is made of gold.

7. A semiconductor device as defined in claim 4 including a metal contact overlying said protective coating.

8. A semiconductor device as defined in claim 1 including an ohmic contact on the surface of said semiconductor material opposite to that of said one surface.

9. A semiconductor device as defined in claim 8 wherein said semiconductor material comprises a first layer of high resistivity and a second layer of low resistivity with said ohmic contact being on said second layer and said metal layer being deposited on the surface of said first layer.

10. A semiconductor device as defined in claim 1 which is encapsulated.

References Cited

UNITED STATES PATENTS

| | | | |
|---|---|---|---|
| 3,271,636 | 9/1966 | Irvin | 317—234 |
| 3,360,851 | 1/1968 | Kahng | 29—590 |
| 3,280,391 | 10/1966 | Bittmann | 317—234 |

JOHN W. HUCKERT, Primary Examiner

M. EDLOW, Assistant Examiner

U.S. Cl. X.R.

117—212; 317—235